United States Patent
Nam et al.

(10) Patent No.: US 6,928,016 B2
(45) Date of Patent: Aug. 9, 2005

(54) REFRESH TYPE SEMICONDUCTOR MEMORY DEVICE HAVING REFRESH CIRCUIT FOR MINIMIZING REFRESH FAIL AT HIGH SPEED OPERATION

(75) Inventors: Kyung-Woo Nam, Seoul (KR); Song-Won Kim, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 162 days.

(21) Appl. No.: 10/359,531

(22) Filed: Feb. 5, 2003

(65) Prior Publication Data

US 2004/0042310 A1 Mar. 4, 2004

(30) Foreign Application Priority Data

Aug. 28, 2002 (KR) ........................................ 2002-51030

(51) Int. Cl.[7] ................................................. G11C 7/00
(52) U.S. Cl. ................... 365/222; 365/210; 365/189.01
(58) Field of Search ............................... 365/222, 210, 365/189.01, 189.05, 233

(56) References Cited

U.S. PATENT DOCUMENTS

| | | | |
|---|---|---|---|
| 4,984,208 A | 1/1991 | Sawada et al. | |
| 5,206,830 A | 4/1993 | Isobe et al. | |
| 6,298,000 B1 * | 10/2001 | Kitade et al. | ................ 365/222 |
| 6,324,113 B1 | 11/2001 | Tomita | |
| 6,343,043 B2 | 1/2002 | Kai et al. | |
| 2001/0026493 A1 | 10/2001 | Leung | |
| 2003/0112687 A1 * | 6/2003 | Tang | ........................ 365/222 |

* cited by examiner

*Primary Examiner*—David Lam
(74) *Attorney, Agent, or Firm*—Marger Johnson & McCollom, P.C.

(57) ABSTRACT

In the refresh type semiconductor memory device having a plurality of refresh type memory cells, for internally performing a refresh operation without an external command together with an input and output operation of data; the refresh type semiconductor memory device includes a refresh circuit having a compulsive refresh request signal generator that disables a refresh request cut-off signal, in response to a signal responding to an active transition of a write enable signal, and a dummy refresh signal generated in a read operation, so as to prevent a refresh fail causable in a consecutive write operation, whereby improving a write cycle time and minimizing a refresh fail at a high speed operation.

8 Claims, 9 Drawing Sheets

REFRESH TYPE SEMICONDUCTOR MEMORY DEVICE HAVING REFRESH CIRCUIT FOR MINIMIZING REFRESH FAIL AT HIGH SPEED OPERATION

This application relies for priority upon Korean Patent Application No. 2002-51030, filed on Aug. 28, 2002, the contents of which are herein incorporated by reference in their entirety.

BACKGROUND OF THE INVENTION

1. Field of the Invention

The present invention relates to a semiconductor memory device; and more particularly, to a refresh type semiconductor memory device having a refresh circuit, which is capable of minimizing a refresh fail at a high speed operation.

2. Description of the Related Art

In general, a random access memory (RAM) stores input data in the inside of an array of storing devices that are known as memory cells and can designate respective addresses. Mainly, two kinds of memory cells are basically used, one of which is a DRAM (Dynamic RAM) cell and another one of which is an SRAM (Static RAM) cell. The SRAM cell has a static latch structure in which data can be stored limitlessly while power is applied. In other words, the SRAM has structure of, for instances, six transistors, or four transistors and two resistances.

The DRAM cell has one access transistor and one storage capacitor. As capacitors have a charge leakage, the DRAM cell has a characteristic that data cannnot be permanently stored. A discharge of charge from the capacitor causes a loss of data. To prevent such a data loss, the DRAM cell requires a periodic refresh operation. A recharge should be performed periodically before the charge is discharged over a constant quantity. Such a periodic refresh operation for each cell is performed several times per second through a refresh circuit so as to prevent the data loss.

Despite such a characteristic requiring the refresh, the DRAM has an advantage over the SRAMin size of a memory cell, the DRAM memory cell is much smaller than the SRAM memory cell even though fabricated through similar processes. According to miniaturization of size, costs of a device is curtailed and more quantity of data can be stored with the same memory area. Therefore, it is desirable to develop the DRAM capable of replacing the SRAM even without an additional external operation condition of a peripheral circuit.

Such a refresh type semiconductor memory device that uses the DRAM cell for requiring a refresh and further performs the same timing operation as a product of SRAM, has been disclosed in several kinds of prior art. Such a refresh type semiconductor memory device has been variously called in this field a PSRAM (Pseudo SRAM), a VSRAM (Virtual SRAM), an UtRAM (Unit transistor RAM), or a pseudo static memory device etc. Such a memory device is a multi chip package type and is often mounted on portable electronic equipment.

An example of the prior art for the refresh type semiconductor memory device, there is patent application Ser. No. 09/609,200 applied for a patent to the USPTO in Jun. 30, 2000, which was invented by Chang-rae, Kim et al. It was disclosed a semiconductor memory device and a method for an operation thereof, which is capable of performing the refresh operation and read/write operation, having a write recovery time of zero and not limitted to a maximum write cycle time.

Figure 1A:
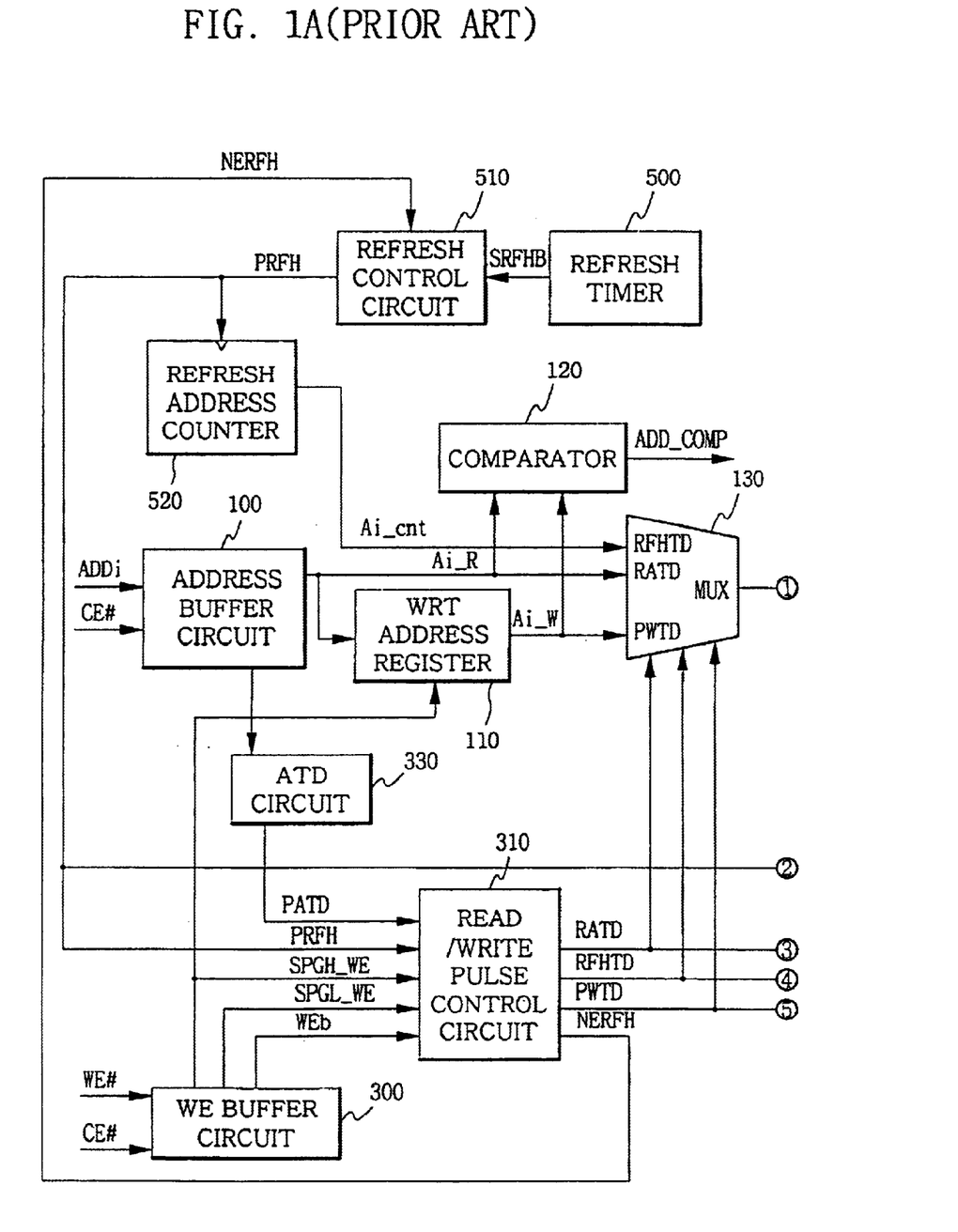
FIGS. 1A to 1D are drawings showing structure and operations of a conventional refresh type semiconductor memory device.

FIG. 1A shows a configuration of a semiconductor memory device 90 disclosed in the above patent. In the device 90, a memory cell array 200 is composed of a refresh type memory cell such as a DRAM cell, a word line WL and a bit line BL. Each memory cell is connected with one word line and one bit line. A row decoder 140 and a column decoder 150 designate addresses of specific memory cells. In an access thereto, when a main pulse generator 320 generates a PWLb pulse after a precharge of the bit line BL, the row decoder 140 selects a word line in response to a row address signal. The selected word line turns on an access transistor inside each memory cell connected to the word line, so that a storage node of each memory cell and a specific bit line connected to this memory cell may commonly use a charge. Then, a sense amplifier (S/A) 410 operates by a PSA pulse. Each sense amplifier measures a voltage of the bit line and senses a charge or a discharge of the memory cell connected to a current specific bit line. The S/A 410 amplifies such an obtained sense signal so as to refresh the memory cell.

A read or write operation is performed in one or more cells. When the main pulse generator 320 generates a PCSL pulse, the column decoder 150 selects a column selection line CSL in response to a column address signal. Each column selection line connects one or more corresponding bit lines with an input/output circuit of the device 90 so as to read and write a memory cell connected to a given word line.

An access to the device 90 starts by read and write commands. Such commands are performed when a signal transition occurs in one or more external input terminals among external input terminals for receiving an address signal ADDi, a chip enable (or called a "chip selection") signal CE#, and a write enable signal WE#. For instances, a read command is performed when a new address signal is represented on ADDi or CE# is activated, while WE# is not activated.

Likewise, the write command is performed through several kinds of methods. Among them, one method is to activate the WE# signal under a state to which the CE# signal was activated. Equally, when to activate the CE# signal under a state to which the WE# signal was activated, the write command is performed, too. When an address on ADDi transitions to a state under the state that all the CE# and WE# signals were activated, a new write command can be given.

An address buffer circuit 100 receives and buffers external signals ADDi and CE#. When one among these signals transitionsed, an ATD (Address Transition Detector) 330 generates a short pulse PATD in response to the transition of ADDi and CE#.

A write enable buffer circuit 300 receives and buffers the external signals WE# and CE#. WE# is supplied as a buffer signal WEb to a read/write pulse control circuit 310. When one out of WE# and CE# transitioned and another one was already activated, the write enable buffer circuit 300 generates a pulse SPGL_WE. When WE# is not activated, the write enable buffer circuit 300 generates a pulse SPGH_WE.

The read/write pulse control circuit 310 generates internal control signals for operating a multiplexer 130, a main pulse generator 320, and a refresh control circuit 510. Input signals of the read/write pulse control signal 310 are PATD, WEb, SPGL_WE and SPGH_WE, and PRFH that is a refresh pulse generated by the refresh control circuit 510. The read/write pulse control circuit 310 generates a refresh selection signal RFHTD during a refresh period, generates a write selection signal PWTD during a write cycle, and generates a read selection signal RATD during a read cycle. Further, the read/write pulse control circuit 310 generates a refresh request cut-off signal NERFH so as to control the refresh control circuit 510, when a refresh is disabled.

The multiplexer (MUX) 130 selects one out of three address signals available when an input address Ai is input to the row decoder 140 and the column decoder 150, in response to the refresh selection signal RFHTD, the write selection signal PWTD and the read selection signal RATD. Among them, a first address signal is an internal address Ai_R. When a new address is input to an external address line ADDi, the address buffer circuit 100 stores this address, and outputs, as Ai_R, the stored address in case that the address corresponds to a read command or a write command. A second address signal is a write address Ai_W. A write address register 110 stores Ai_R during a write cycle, and then outputs the stored value as Ai_W before other value is stored during a next write cycle. A third address signal is a refresh address Ai_cnt. The multiplexer 130 selects Ai_R during reading the memory cell array 200, selects Ai_W during writing the memory cell array 200, and selects during refreshing the memory cell array 200.

The refresh circuit of the device 90 is constructed of a refresh timer 500, a refresh control circuit, a refresh address counter 520 and a read/write pulse control circuit 310. The refresh timer 500 generates pulses on a refresh request line SRFHB with a constant timing interval. The timing interval is controlled so as to prevent a loss of data by a refresh speed.

The refresh control circuit 510 receives an SRFHB pulse when NERFH is permitted. If NERFH is not permitted, the refresh control circuit 510 does not receive the SRFHB pulse.

The refresh address counter 520 counts addresses through an address designation method on respective word lines in a given order. When PRFH is input, the refresh address counter 520 changes a value of an output Ai_cnt.

The read/write pulse control circuit 310 generates a refresh control signal RFHTD and NERFH in response to an input. RFHTD permits a refresh operation. NERFH prohibits requesting a refresh operation among a pulse read operation and a pulse write operation.

Further, the semiconductor memory device 90 includes circuits to precisely process a write operation, such as a write address register 110, a comparator 120, a bypass control circuit 160, a data input register 440, a data output register 450, and a data output multiplexer 430, etc. The write address register 110 stores a value of Ai_R in response to a pulse signal input to SPGH_WE, namely, a final portion of external write cycle. Simultaneously, and according to SPGH_WE, the data input register 440 stores data input information at a current data input buffer 460. The registers 110, 440 consecutively output these store values till a next SPGH_WE pulse is input.

Figure 1B:
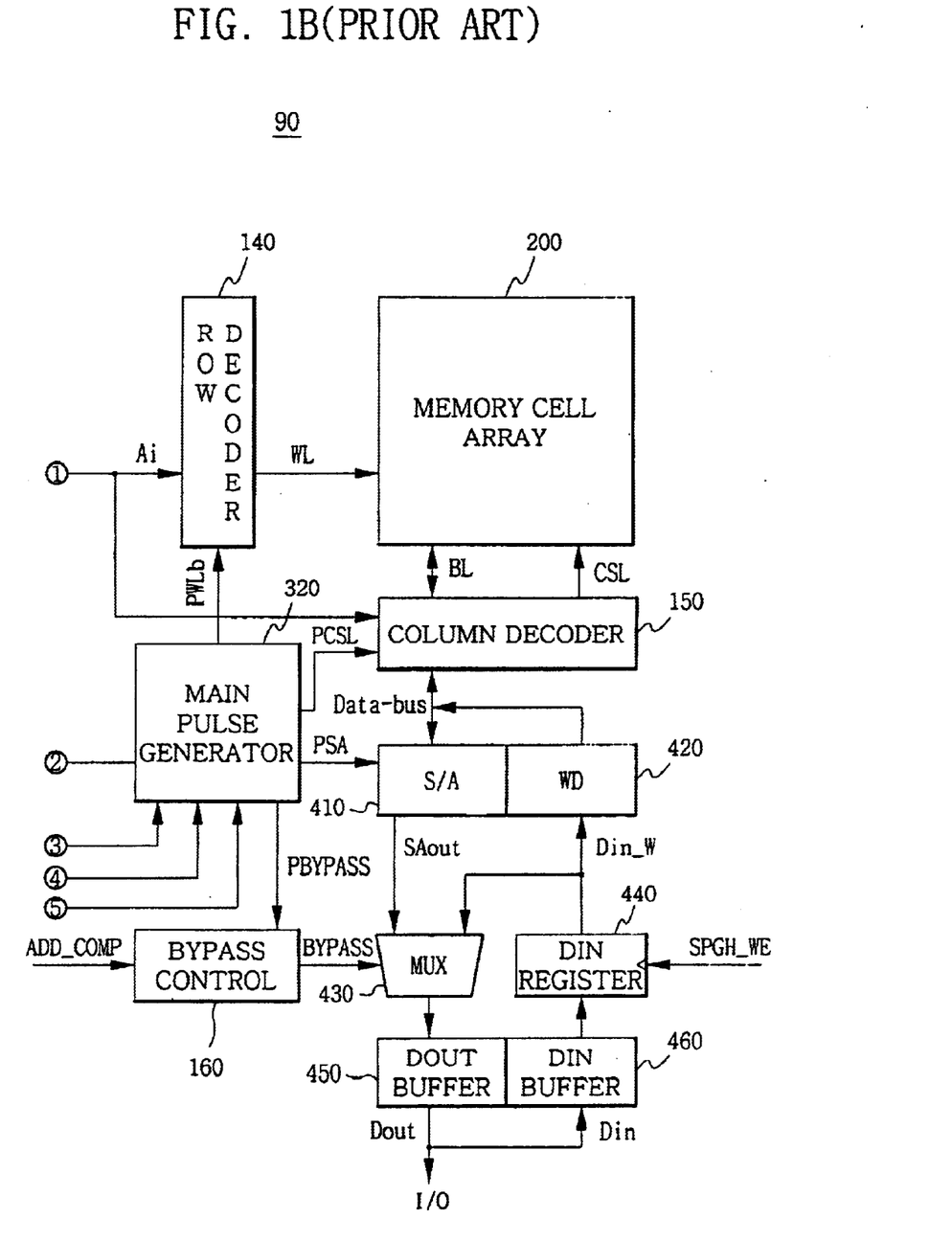
Figure 1C:
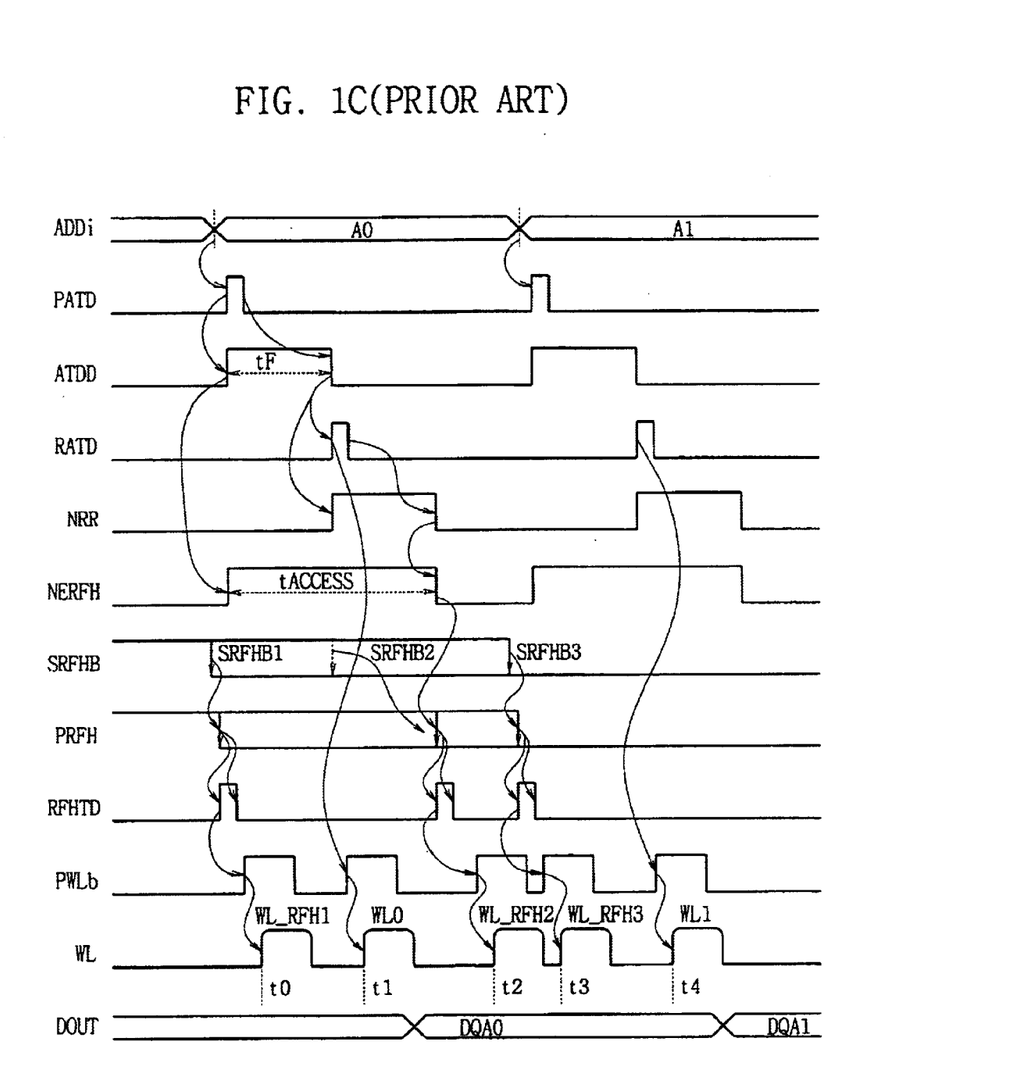
Figure 1D:
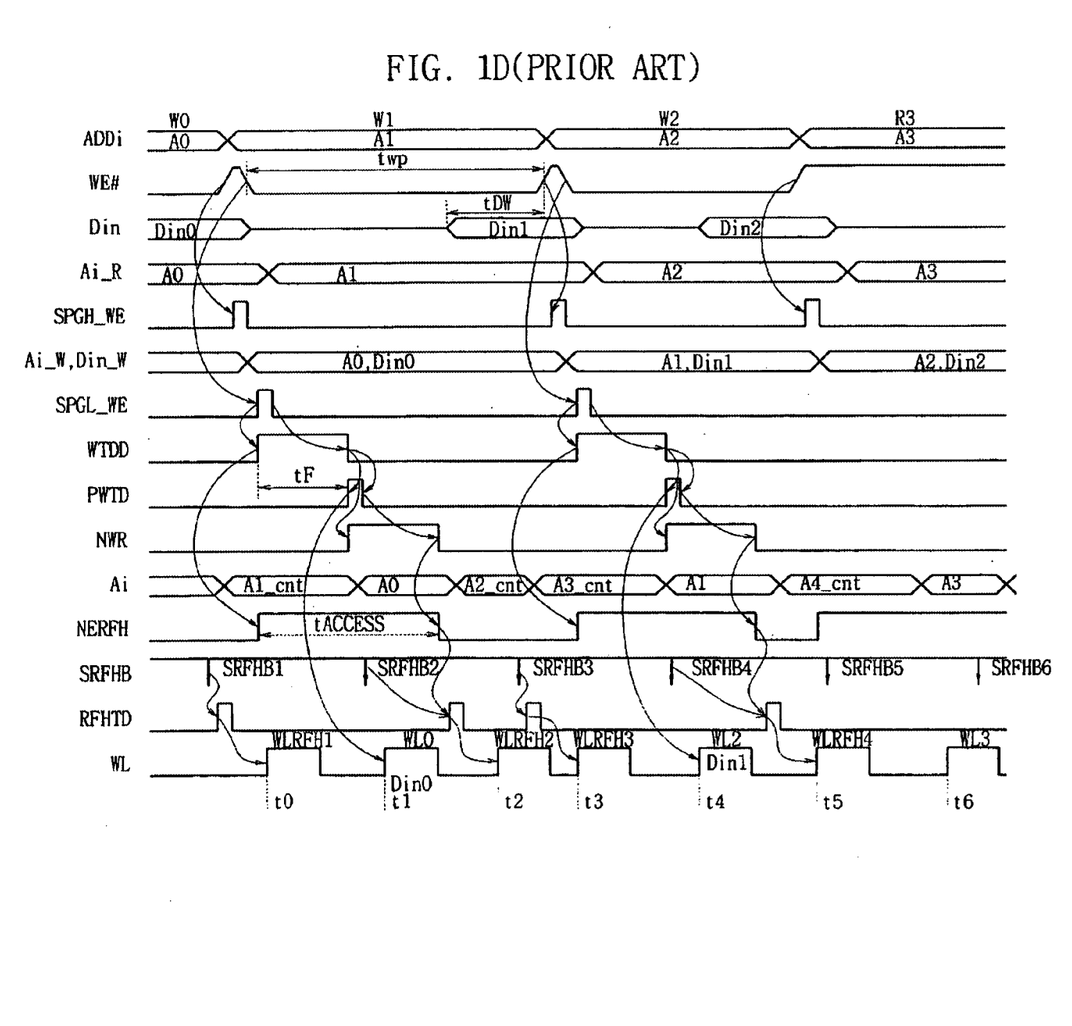

FIG. 1B is a timing diagram for showing a general read operation of the device shown in FIG. 1A, and FIG. 1C is a timing diagram for showing a general write operation.

With reference to FIG. 1B, when ADDi transitions (to an address A0), a pulse read operation is triggered. The ATD circuit 330 generates a short pulse PATD. Inside the read/write pulse control circuit 310, a pulse diffuser generates an ATDD pulse having a length of tF and responds to the PATD pulse. The ATDD pulse known as a "dummy refresh" provides a time period enough to complete a stand-by refresh operation in the midst of a general read cycle. Further, the ATDD pulse activates NERFH as a high state so as to block a request for a new refresh operation.

On a final portion of the dummy refresh pulse, a short pulse RATD is generated to start on a pulse read operation. This pulse selects, as an output address Ai of the address multiplexer, Ai_R (containing address A0). The RATD pulse generates an array address pulse PWLb for a read access, so as to thereby select WL0 during a given pulse width time starting at t1. When data DQA0 is output from a data output buffer, a pulse read operation is completed immediately.

In the pulse read operation, the pulse diffuser within the read/write pulse control circuit 310 generates a general read request NRR pulse. The NRR pulse provides a time enough to complete the pulse read operation. On a final portion of the NRR pulse, NERFH is not activated and a refresh request is available. Herewith, a period where a refresh is prohibited, has tACCESS as such a timesubstantially equal to the length of the refresh pulse and a general read request pulse.

FIG. 1B also shows a refresh request signal having three kinds of timings on SRFHB that includes SRFHB1 generated immediately before that ADDi transitions to A0, SRFHB2 generated while NERFH is activated, and SRFHB3 generated in the same external read cycle but after the pulse read operation.

FIG. 1C shows two external write operations W1 and W2 subsequently to a read operation R3. Together with a start of timing, an external write operation W0 is completed immediately.

The external write operation W1 transitions to an address A1 at ADDi, and the write enable WE# starts to be performed with a transition to a low state. Just before that, WE# transitions to a high state to inform of an end of the external write operation W0 and trigger a pulse of SPGH_WE. By such a pulse, Ai_W stores A0 from Ai_R, and stores Din0 in Din.

When the external write operation W1 starts to be performed, the pulse write operation is triggered to thus write Din0 in a cell array that is positioned in an address corresponding to A0. When WE# transitions to a low state, SPGL_WE pulse is triggered. The read/write pulse control circuit 310 generates a diffusion pulse WTDD of the dummy refresh period, like at the dummy refresh period. On a final portion of the dummy refresh period, the read/write pulse control circuit 310 generates a short pulse PWTD, and generates a diffusion pulse NWR responding thereto. A terminal of the diffusion pulse defines a terminal of a pulse write command. When the PWTD pulse is input, the address multiplexer selects Ai_W (namely, A0 in this embodiment), as the address Ai, and sends it to the row decoder and the column decoder. The PWTD pulse starts on a write pulse sequence of the main pulse generator so as to select a word line WL0 at the time t1. While WL0 is selected, Din0 is written at the memory cell array 200 through a write driver 420.

When the pulse write cycle is completed, the device restarts on a refresh operation till the external signal, e.g., a high transition of WE#, informs of an end of the external write cycle. When the external signal transitions to a high state, a pulse of SPGH_WE stores A1 and Din1 and represents these values at Ai_W and Din_W respectively.

The external write cycle W2 is subsequent immediately to the external write cycle. A process of W2 is similar to a process of W1, and contains a pulse write operation for writing A1 at the memory cell array. The refresh operation of FIG. 1C is similar to the refresh operation of FIG. 1B described above.

The normal operation and the refresh operation in the refresh type semiconductor memory device having a DRAM cell were described as the above.

As the semiconductor memory device 90 is recognized as an SRAM, by an external system, e.g., a microprocessor, all operations should be externally performed regardless of the refresh operation. Therefore, as a normal active period and a refresh operation period should be ensured together during one active cycle, some portion out of one active cycle is determined as the refresh period, and the rest is determined as the normal active operation period. In order for such a distinctive operation, a refresh blocking window is needed. That is, at a period where the refresh blocking signal named a refresh request cut-off signal NERFH is high, an approach of a refresh is inhibited, and only at a low period thereof, the refresh approach is valid, so as to thus enable to together execute the normal active operation and the refresh operation at one active cycle.

It will be able to sufficiently understand through the above description that the refresh request cut-off signal NERFH was generated in the read/write pulse control circuit 310 that was contained into the refresh circuit of the device 90. However, it was observed by the inventors of the present invention that, because the read/write pulse control circuit 310 has the construction like FIG. 2, the higher the active cycle speed is, the higher a probability of a refresh fail is.

The following explanation for a probability of refresh fail is provided only for the sake of a thorough understanding of the invention without other intention.

Figure 2:
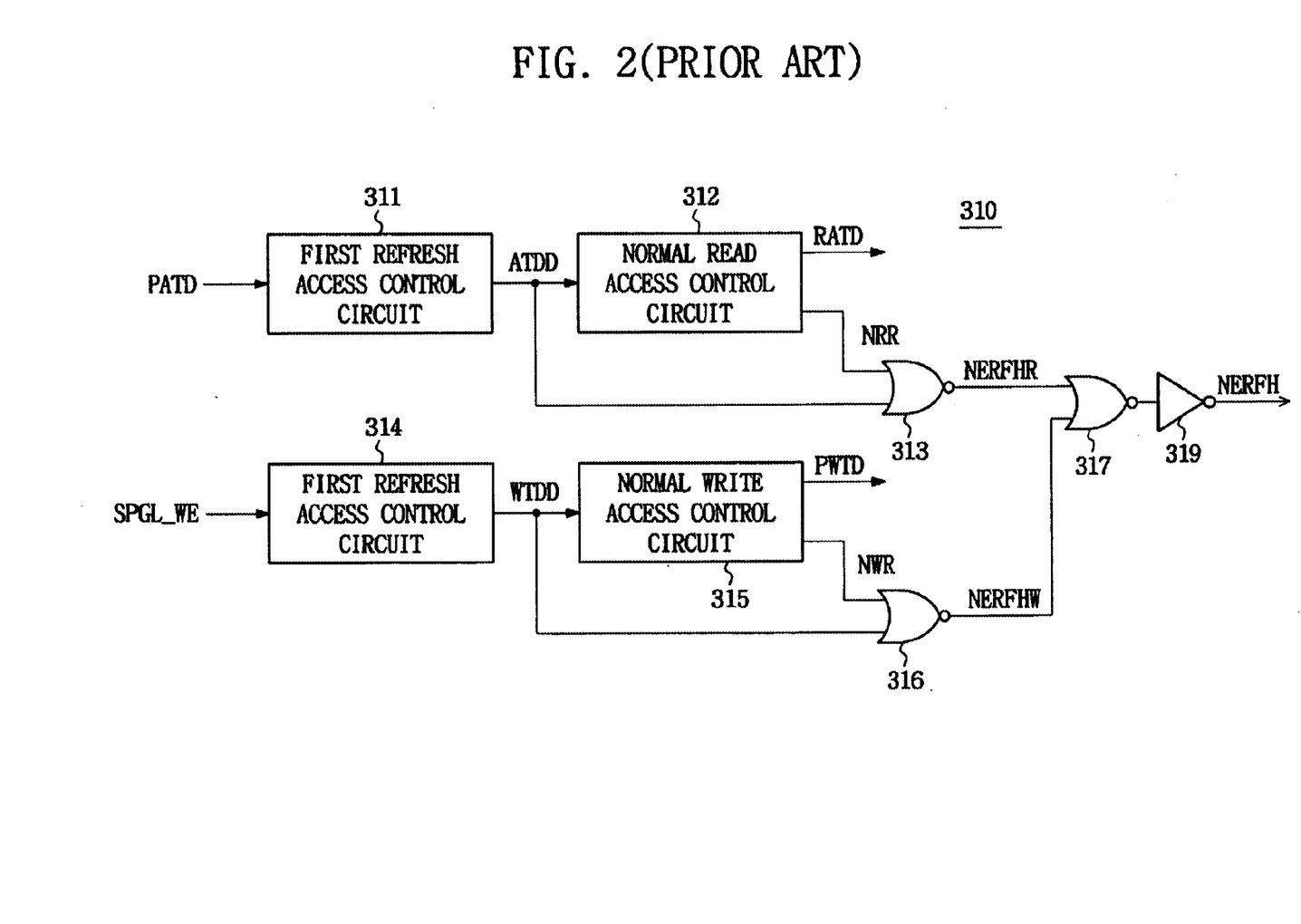
FIG. 2 is a block diagram showing a conventional construction of a read/write pulse control circuit shown in FIG. 1A.

FIG. 2 is a conventional block diagram of the read/write pulse control circuit 310 shown in FIG. 2, among constructive parts of the device shown in FIG. 1A.

In FIG. 2, a first refresh access control circuit 311 has a pulse diffuser for augmenting the PATD pulse and generating a dummy refresh pulse ATDD, in the inside thereof. ATDD is applied to a normal read access control circuit 312. The circuit 312 generates the short pulse RATD for commencing a read operation in response to a falling edge of the dummy refresh pulse, and also generates a long pulse NRR so as to cut off a refresh operation in a read operation. An NOR gate 313 sums up ATDD and NRR, and generates a signal NERFHR. Therefore, NERFHR is retained during a time gotten by adding up lengths of the ATDD pulse and the NRR pulse, namely, during a pulse read access time tACCESS.

The second refresh access control circuit 314 has a pulse diffuser for augmenting an SPGL_WE pulse and generating a dummy refresh pulse WTDD. WTDD is an input and is connected to a normal write access control circuit 315. The circuit block 315 generates a short pulse PWTD for commencing a write operation in response to a falling edge of the dummy refresh pulse, and further generates a long pulse NWR so as to cut off a refresh operation in a write operation. An NOR gate 316 combines WTDD and NWR, and generates a signal NERFHW. Therefore, NERFHW is maintained during a time gotten by adding up lengths of a WTDD pulse and an NRW pulse, namely, during a pulse write access time tACCESS.

NERFHR and NERFHW are combined by an NOR gate 317, to then m NERFH through an inverter 319. The signal NERFH is the refresh request cut-off signal and is activated in the read and write operations.

Figure 3:
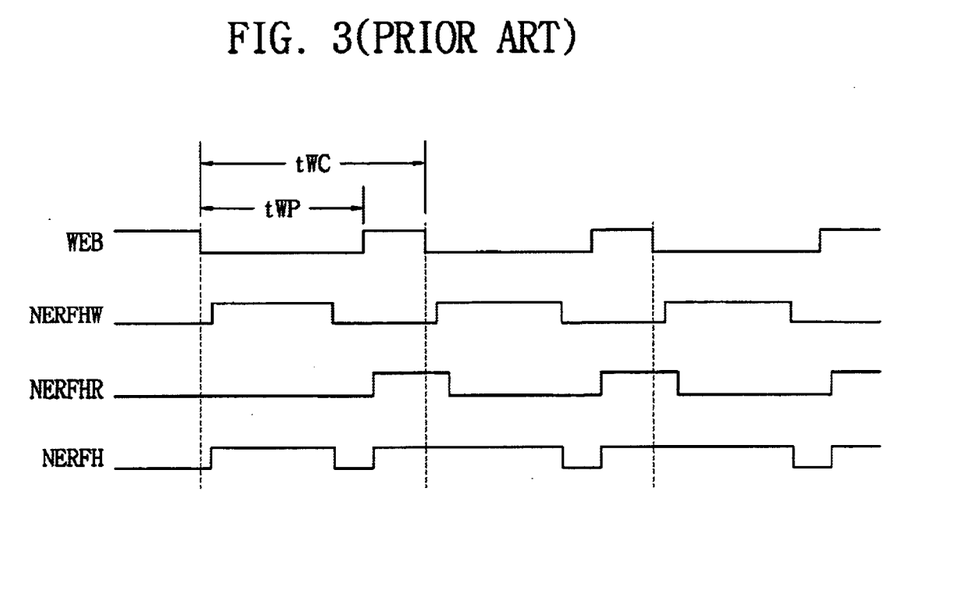
FIGS. 3 and 4 are timing drawings for FIG. 2.
Figure 4:
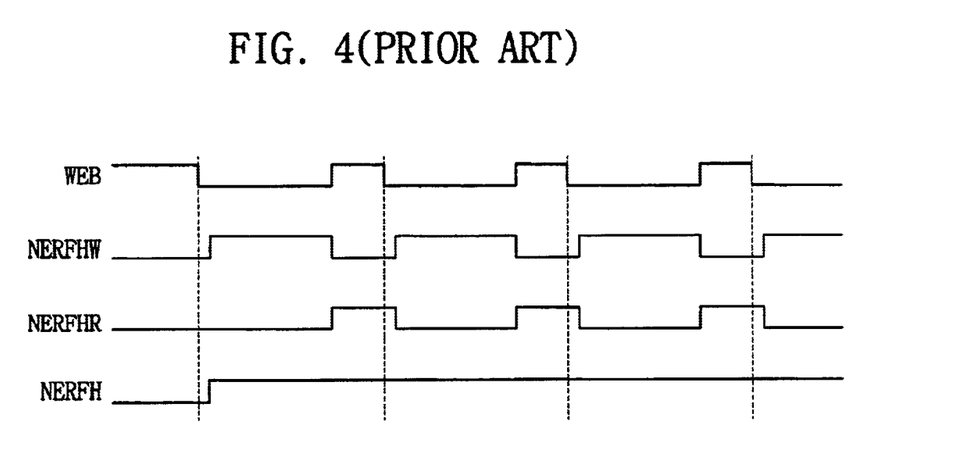

FIGS. 3 and 4 are timing drawings for operations in FIG. 2, and show each of cases for long write cycle and short write cycle. tWC and tWP of the drawing respectively indicate a write cycle and a write command pulse width.

In an operating mode, the device 90 recognizes as a write operation when WEB (or WE#) is low, and recognizes as a read operation when WEB (or WE#) is high. In comparison with a case of FIG. 3, when operating frequency is increased as shown in FIG. 4, a section of tWC and tWP is reduced. In case that this section is gradually reduced, a low section of the NERFH shown in FIG. 3 is gradually reduced, and then, finally becomes a state that the low section does not exist as shown in FIG. 4. That is, NERFH continuously exists only as a high state without a low section owing to a lack of margin between NERFHW and NERFHR. Such a phenomenon occurs in a case of a consecutive write operation, and an approach for a refresh operation is blocked, so as not to perform the refresh operation for a memory cell. Therefore, the higher an operating frequency of the device is, the higher a probability of such a refresh fail is. When the refresh fail occurs, data stored at the memory cell is lost, which drops a reliability of the semiconductor memory device.

SUMMARY OF THE INVENTION

Therefore, an object of the present invention is to provide a refresh type semiconductor memory device having a refresh circuit, which is capable of minimizing a refresh fail in a high speed operation.

Another object of the present invention is to provide a refresh type semiconductor memory device that is capable of minimizing a probability of refresh fail in a consecutive write cycle.

A still another object of the present invention is to provide a refresh circuit of a refresh type semiconductor memory device and a method of generating a refresh request cutoff signal, which is capable of improving a write cycle time.

To achieve these objects, in accordance with one aspect of the present invention, a refresh type semiconductor memory device having a plurality of refresh type memory cells, for internally performing a refresh operation without an external command together with an input/output operation of data, have a refresh circuit, wherein the refresh circuit has a compulsive refresh request signal generator for disabling a refresh request cut-off signal in response to a signal responding to an active transition of a write enable signal, and a dummy refresh signal generated in a read operation, whereby improving a write cycle time and minimizing a refresh fail causable in a consecutive write operation.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to FIGS. 5 through 9.

With reference to the drawings with an inventive refresh circuit of a semiconductor memory device, constructive elements having the same or similar functions are represented with the same or similar reference characters and numbers even on mutually different drawings.

Figure 5:
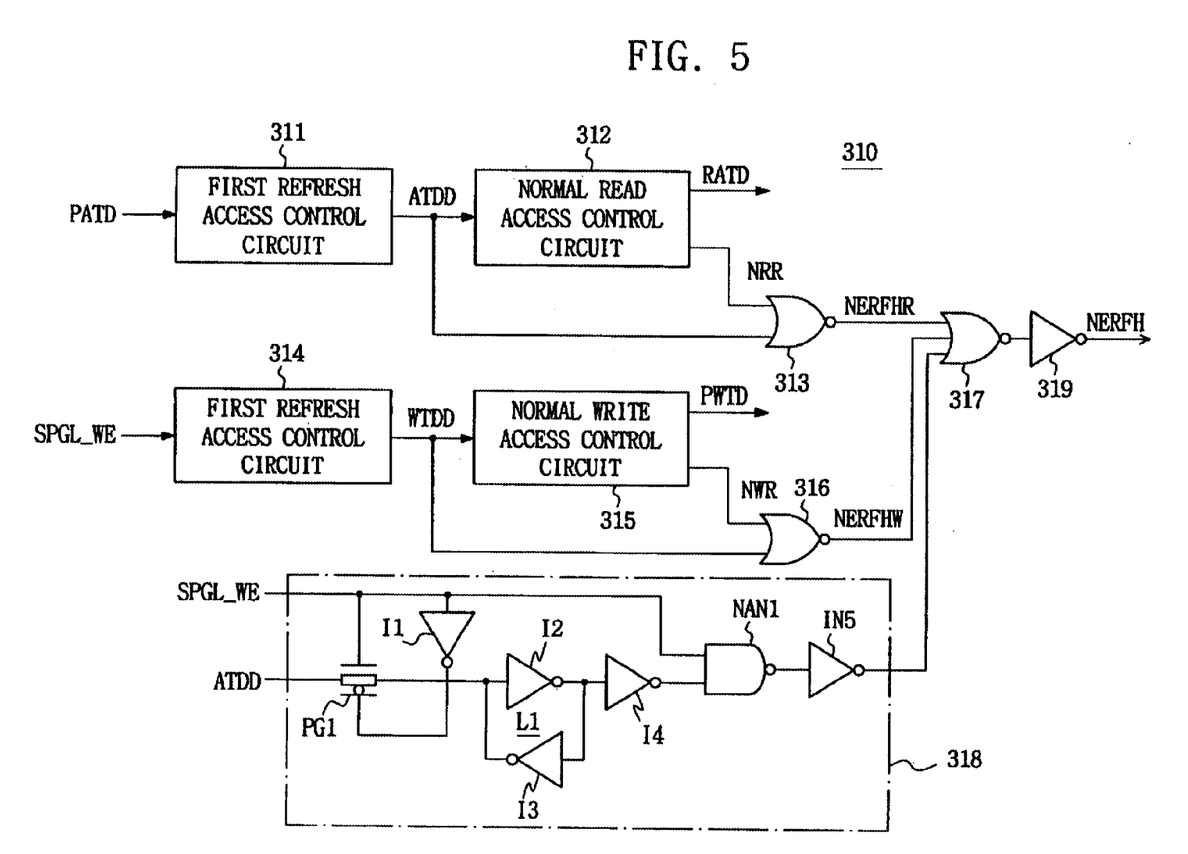
FIG. 5 is a block diagram of a refresh circuit in an embodiment of the present invention.

FIG. 5 is a block diagram showing in detail a refresh circuit in an embodiment of the present invention. In FIG. 5, a circuit block 318 is provided as an additional construction to the construction of FIG. 2. The circuit block 318 will be named a compulsive refresh request signal generator for the sake of a convenience in the inventive embodiment.

The compulsive refresh request signal generator 318 has a function of disabling a refresh request cut-off signal NERFH in response to a pulse signal SPGL_WE responding to an active transition of a write enable signal WEB, WE#, and a dummy refresh pulse signal ATDD generated in a read operation.

The compulsive refresh request signal generator 318 includes a transmission gate PG1 for outputting a dummy refresh pulse signal ATDD in response to the pulse signal SPGL_WE; an inverter I1 for inverting the pulse signal SPGL_WE; an inverter latch L1 for latching the dummy refresh pulse signal ATDD output from the transmission gate PG1, wherein L1 is comprised of inverters I2 and I3 in the shown embodiment; an inverter I4 for inverting an output of the inverter latch L1; an NAND gate NAN1 for combining an output of the inverter I4 and the pulse signal SPGL_WE, and generating a NAND response; and an inverter IN5 for inverting an output of the NAND gate NAN1.

A compulsive refresh request signal output through the inverter IN5 is applied as an input of a NOR gate 317 to disable the refresh request cut-off signal NERFH.

FIGS. 6 to 9 are timing drawings for FIG. 5.

Figure 6:
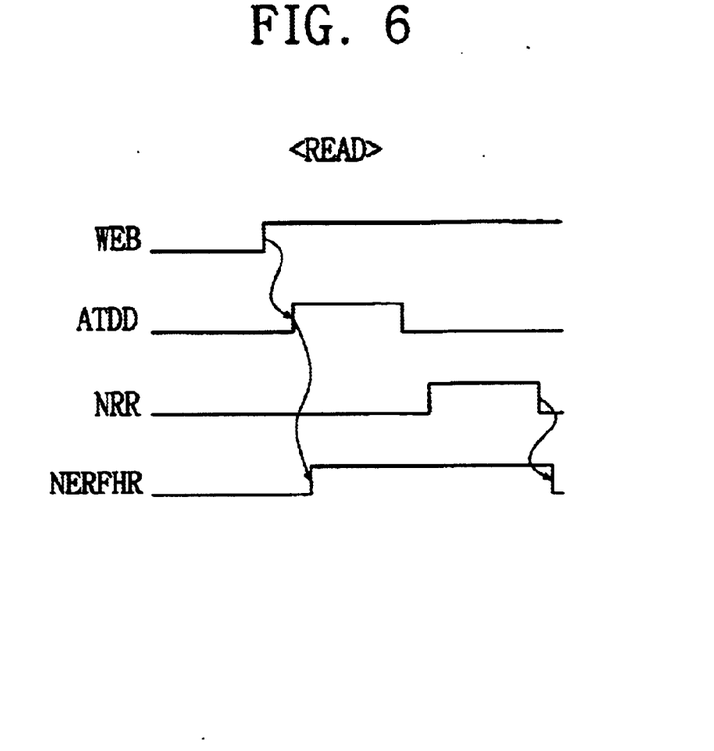
FIGS. 6 to 9 are timing drawings for FIG. 5.
Figure 7:
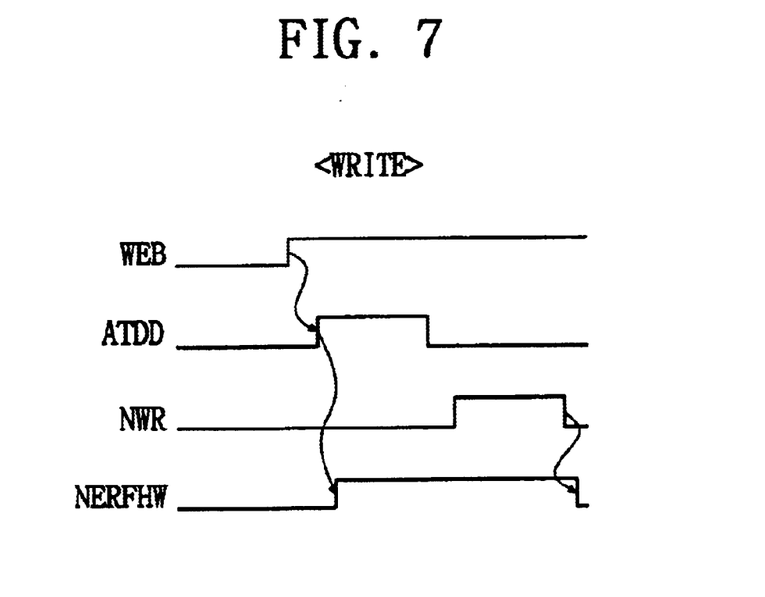

Referring first to FIGS. 6 and 7, a signal NERFHR and a signal NERFHW are respectively generated in a read operation and a write operation. The signal NERFHR is generated by a NOR gate 313 shown in FIG. 5, and the signal NERFHW is generated by a NOR gate 316 shown in FIG. 5.

Figure 8:
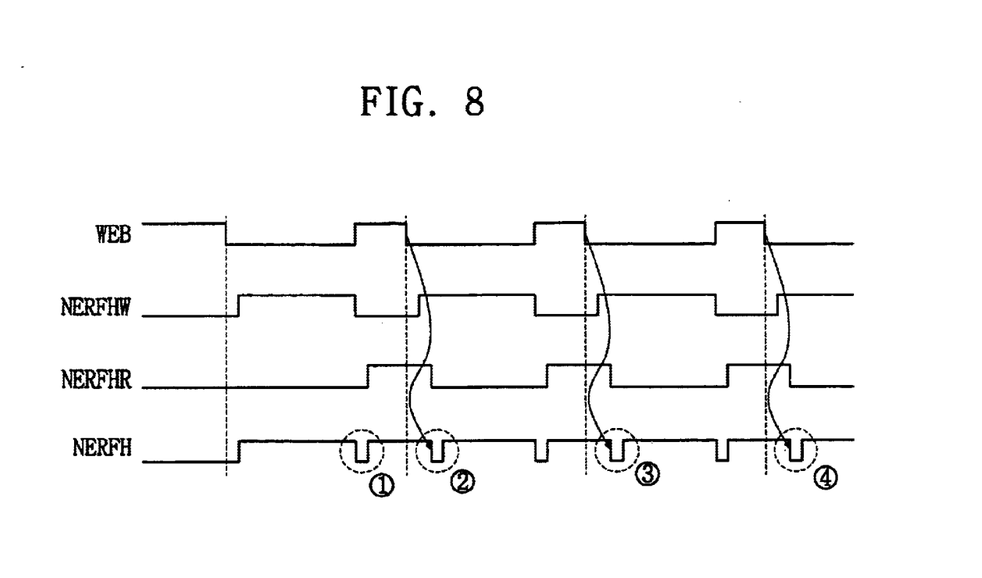

With reference to FIG. 8 showing the timing drawing, in a comparatively long cycle, a waveform of the refresh request cut-off signal NERFH has a low section like a referential number ①. That is, the low section of ① is generated by OR-gating the signals NERFHR and NERFHW. As shown in a timing drawing of FIG. 9, in an operating cycle shorter than FIG. 8, a low section where all the signals NERFHR and NERFHW become low, may not exist, therefore the NERFH may not have the low section as shown in FIG. 4. That is, there is a possibility of a refresh fail. However, in the embodiment of the present invention, although a write operation is consecutively performed at a high speed operation cycle, low sections shown in referential numbers ②, ③, ④ are compulsively made as shown in FIG. 8 at the high speed operation cycle. This is obtained by an operation of the compulsive refresh request signal generator 318.

As the compulsive refresh request signal generator 318 receives the signals SPGL_WE, ATDD, the compulsive refresh request signal generator 318 starts to operate at a second write operational section in the consecutive write operation, to thus generate a low pulse and apply it to a NOR gate 319. The generated low pulse section has a shape responding to the write enable signal.

Figure 9:
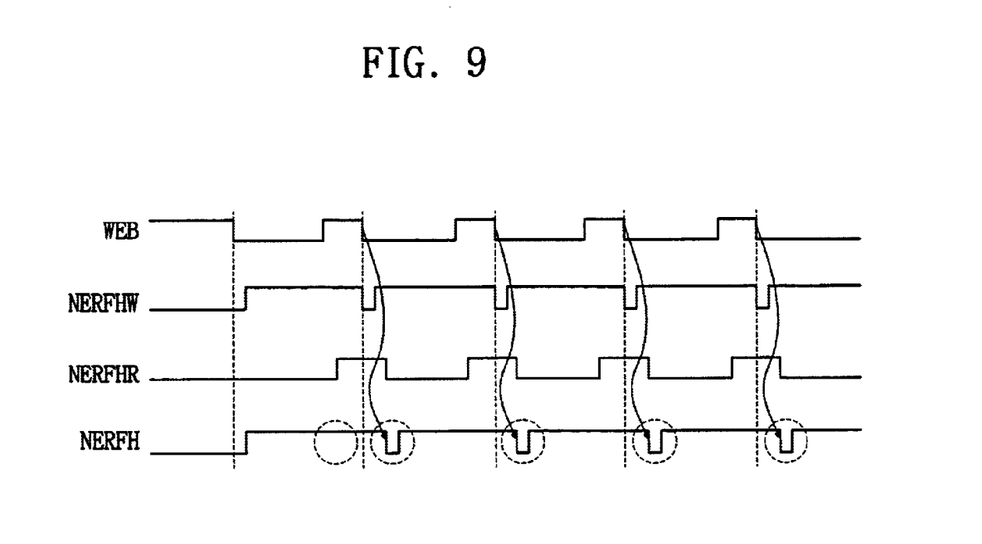

In the signal NERFH, the low sections of ②, ③, ④ are the signals generated in the compulsive refresh request signal generator 318. Thus, as shown in FIG. 9, the low sections of ②, ③, ④ are generated compulsively even in the high speed operation cycle, although the low section of ① is not represented.

In case that NERFH continuously exists as only a high state without a low section at a high speed operation owing to a margin lack between NERFHW and NERFHR, the compulsive refresh request signal generator 318 operates so that NERFH can have the low section. Accordingly, the refresh operation can be performed within the operation section of the consecutive write cycle, so as to minimize a provability of refresh fail and improve a write cycle time through a high speed write operation.

In addition, the above-mentioned internal timing signal just provides a portion of the inventive operating methods, thus more effective and various methods can be provided through a designer of a circuit without deviating from a scope of the invention.

As afore-mentioned, in accordance with the present invention, a refresh type semiconductor memory device having a refresh circuit has an advantage of preventing the refresh fail at a high speed operation of a consecutive write operating cycle and improving a write cycle time.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. A refresh type semiconductor memory device having a plurality of refresh type memory cells and internally performing a refresh operation without an external command together with an input/output operation of data, said device comprising:

a refresh circuit having a compulsive refresh request signal generator, said compulsive refresh request signal generator to disable a refresh request cut-off signal in response to a signal responding to an active transition of a write enable signal, and a dummy refresh signal generated in a read operation, so as to prevent a refresh fail causable in a consecutive write operation.

2. The device of claim 1, wherein said signal responding to the active transition of the write enable signal, and said dummy refresh signal generated in the read operation, are respectively pulse signals.

3. The device of claim 1, wherein said compulsive refresh request signal generator comprises:

a transmission gate for outputting the dummy refresh signal in response to the signal responding to the active transition of the write enable signal;

an inverter latch for latching the dummy refresh signal output from the transmission gate;

an inverter for inverting an output of the inverter latch; and an OR gate for combining an output of the inverter and the signal responding to the active transition, and generating an OR response.

4. A refresh type semiconductor memory device having a refresh circuit, said refresh type semiconductor memory device having a plurality of refresh type memory cells and being for internally performing a refresh operation without an external command together with an input/output operation of data, said refresh circuit comprising:

a read/write pulse control circuit for OR-gating a read refresh request cut-off signal and a write refresh request cut-off signal, generating a refresh request cut-off signal, and applying the generated signal to a refresh control circuit; and a compulsive refresh request signal generator for disabling the refresh request cut-off signal, in response to a signal responding to an active transition of a write enable signal, and a dummy refresh signal generated in a read operation, so as to prevent a refresh fail causable in a consecutive write operation.

5. The device of claim 4, wherein said compulsive refresh request signal generator comprises:

a transmission gate for outputting the dummy refresh signal in response to the signal responding to the active transition of the write enable signal;

an inverter latch for latching the dummy refresh signal output from the transmission gate;

an inverter for inverting an output of the inverter latch;

a NAND gate for combining an output of the inverter and the signal responding to the active transition, and generating a NAND response; and an inverter for inverting an output of the NAND gate.

6. A method for ensuring a refresh section, in a semiconductor memory device that performs an SRAM interface under structure of a DRAM cell and has a dummy section in reading/writing so as to internally perform a refresh operation by using a refresh approach blocking signal, said method comprising the step of:

generating a specific refresh approach signal in response to a signal generated when performing a next write operation at a read dummy section, under such a case that the read dummy section and a read operation section are defined in a read operation, and a write dummy section and a write operation section are defined in a write operation, and a refresh blocking section is then defined by combining the read/write dummy sections and the read/write operation sections.

7. A memory device, comprising:

an array of memory cells; and a refresh circuit having a signal generator to disable a refresh request cut-off signal in response to a write enable signal and to generate a dummy refresh signal, so as to prevent a refresh fail due to consecutive write operations.

8. A compulsive refresh request signal generator, comprising:

a transmission gate to output a dummy refresh signal in response to a signal responding to an active transition of a write enable signal;

an inverter latch to latch the dummy refresh signal output from the transmission gate;

an inverter to invert an output from the inverter latch; and an OR gate to combine an output of the inverter and the signal responding to the active transition and to produce an OR response.

* * * * *